United States Patent
Jeong et al.

(10) Patent No.: US 10,348,322 B1
(45) Date of Patent: Jul. 9, 2019

(54) ON-CHIP TRIMMING CIRCUIT AND METHOD THEREFOR

(71) Applicant: NXP USA, INC., Austin, TX (US)

(72) Inventors: Jae Woong Jeong, Austin, TX (US); Leroy Winemberg, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/018,460

(22) Filed: Jun. 26, 2018

(51) Int. Cl.
  *H03M 1/12* (2006.01)
  *H03M 1/46* (2006.01)
  *G05F 3/30* (2006.01)

(52) U.S. Cl.
  CPC .................. *H03M 1/46* (2013.01); *G05F 3/30* (2013.01)

(58) Field of Classification Search
  CPC ............ H03M 1/46; H03M 1/12; H03M 1/66; H03M 1/747; H03M 1/00; H03M 1/802; H03M 1/804; H03M 1/806; G05F 3/30
  USPC .................................................. 341/155, 161
  See application file for complete search history.

(56) References Cited

U.S. PATENT DOCUMENTS

| | | | |
|---|---|---|---|
| 5,325,045 A | 6/1994 | Sundby | |
| 5,995,033 A * | 11/1999 | Roeckner | H03M 1/02 341/108 |
| 6,590,372 B1 | 7/2003 | Wiles, Jr. | |
| 7,839,315 B2 * | 11/2010 | Hesener | H03M 1/183 341/144 |
| 8,022,751 B2 | 9/2011 | Le et al. | |
| 8,988,263 B2 * | 3/2015 | Zhan | H03M 1/46 341/118 |
| 9,154,152 B1 * | 10/2015 | Chiu | H03M 1/468 |
| 2006/0043957 A1 | 3/2006 | Carvalho | |
| 2008/0122495 A1 | 5/2008 | Boerstler et al. | |
| 2010/0001892 A1 * | 1/2010 | Aruga | H03M 1/1047 341/172 |
| 2011/0102217 A1 * | 5/2011 | Hsu | H03M 1/1042 341/120 |
| 2014/0015699 A1 * | 1/2014 | Zhao | H03M 1/0604 341/110 |
| 2015/0263756 A1 * | 9/2015 | Chiu | H03M 1/468 341/118 |
| 2017/0207794 A1 * | 7/2017 | Chung | H03M 1/466 |

* cited by examiner

*Primary Examiner* — Jean B Jeanglaude

(57) ABSTRACT

A semiconductor device includes a trimming circuit for a power management circuit. The trimming circuit includes an analog to digital converter (ADC) circuit with a comparator circuit, a successive approximation register (SAR) circuit having an input coupled to an output of the comparator circuit, a control circuit coupled to the SAR circuit, a digital to analog converter (DAC) circuit having inputs selectively couplable to digital output signals of the SAR circuit and an output coupled to a first input of the comparator circuit, and a variable resistance circuit configured to be selectively coupled to output signals of the ADC circuit.

20 Claims, 2 Drawing Sheets

US 10,348,322 B1

ON-CHIP TRIMMING CIRCUIT AND METHOD THEREFOR

BACKGROUND

Field

This disclosure relates generally to integrated circuits, and more specifically, to on-chip trimming circuits.

Related Art

Power management units (PMUs) commonly include blocks such as a bandgap reference (BGR) circuit and a low-dropout regulator (LDO) circuit. These circuits need to be trimmed during production testing because they suffer from process variation. Typically, Automatic Test Equipment (ATE) is used to trim these circuits of the PMU. However, trimming with an ATE takes a long time, therefore increasing production time and cost. Also, once trimming is done with an ATE during production testing, further calibration cannot be done. This is a problem since these trimmed circuits may need trimming after release to a customer. For example, the LDO output voltages change with different load currents, and therefore a need exists to compensate for these voltage changes even after a System on Chip (SoC) is released to a customer.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment of the present invention, a trimming circuit capable of being integrated on-chip within an SoC includes of a Successive Approximation Register (SAR) Analog to Digital Converter (ADC). The SAR ADC can be used to measure an accurate reference voltage, which may be provided by ATE or a trimmed BGR, and store a corresponding digital code. The stored code may then be used, during operation, to allow the SAR ADC to trim the PMU, such as to trim an on-chip BGR or LDO which may need further calibration after production. In one embodiment, the SAR ADC includes a comparator, SAR and control circuitry, a Digital to Analog Converter (DAC), a variable resistance string (R-string), and a storage circuit (e.g., a register). The trimming circuit also includes a set of switch banks, in which one switch bank is coupled between the SAR and control circuitry and the DAC, another between the SAR and control circuitry and the R-string, and another between the DAC and the register. By controlling each switch bank, the SAR ADC can be used for both the reference voltage measurement and for the on-chip trimming.

Figure 1:
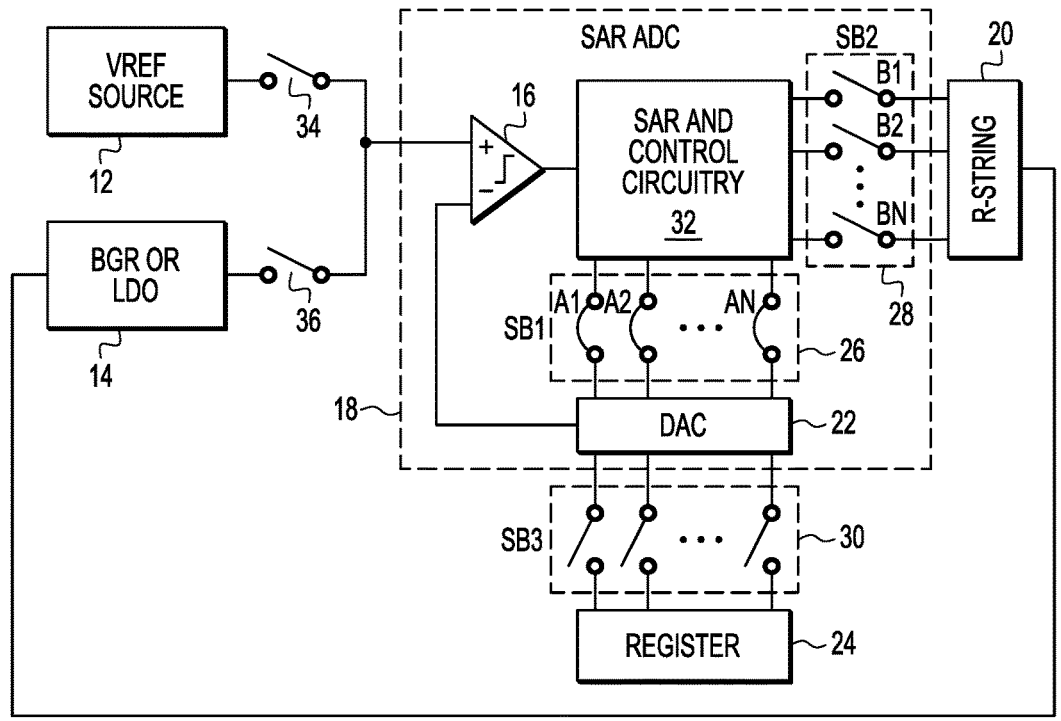
FIGS. 1-3 illustrate, in partial schematic and partial block diagram form, a trimming circuit having different switch settings in accordance with an embodiment of the present invention.

FIG. 1 illustrates a trimming circuit 10 capable of being used on-chip in an SoC (and may also be referred to as a built-in trimming circuit). Trimming circuit 10 includes switches 34 and 36, an SAR ADC 18, a register 14, an R-string 20, an LDO 14, and switch banks 26, 28, and 30. Note that LDO 14 can be any circuit requiring trimming, such as a BGR, and may be referred to as a power management circuit. However, LDO 14 will be used herein as an example. SAR ADC 18 includes a comparator 16, SAR and control circuitry 32 (also referred to as a digital approximation and control circuit), a DAC 22, and switch banks 26 and 28. Each switch described herein includes a first and a second data terminal, and a control terminal, in which, depending on the value received at the control terminal, either connects the first and second terminals (referred to as closed) or disconnects the first and second terminals (referred to as open). In one embodiment, each switch is implemented as a MOS transistor. However, the switches can be implemented with any type of switch circuit, and the switches need not all be the same type of switch circuit. In the current embodiment, each switch bank includes N switches.

Still referring to FIG. 1, comparator 16 includes a non-inverting input coupled to a first data terminal of each of switches 34 and 36. An output of comparator 16 is coupled to SAR and control circuitry 32. A first terminal of each switch of switch bank 28 is coupled to SAR and control circuitry 32, and a second terminal of each switch of switch bank 28 is coupled to R-string 20. SAR and control circuitry 32 provides N control values, B1-BN, to the control terminals of each switch of switch bank 28. A first terminal of each switch of switch bank 26 is coupled to SAR and control circuitry 32, and a second terminal of each switch of switch bank 26 is coupled to a digital input of DAC 22. SAR and control circuitry 32 provides N control values or bits, A1-AN, to control terminals of switches in switch bank 30. A second terminal of each switch in switch bank 28 is coupled to R-string 20. An analog output of DAC 22 is provided to an inverting input of comparator 16. A first terminal of each switch in switch bank 30 is coupled to DAC 22 and a second terminal of each switch in switch bank 30 is coupled to register 24. In one embodiment, SAR and control circuitry 32 provides a first control value simultaneously to control terminals of each switch in switch bank 30. SAR and control circuitry 32 may also provide a second control value to a control terminal of switch 34, and a third control value to a control terminal of switch 36. A voltage source 12 provides an accurate reference voltage, Vref, to the second terminal of switch 34. LDO 14 provides an LDO output to the second terminal of switch 36.

Figure 2:
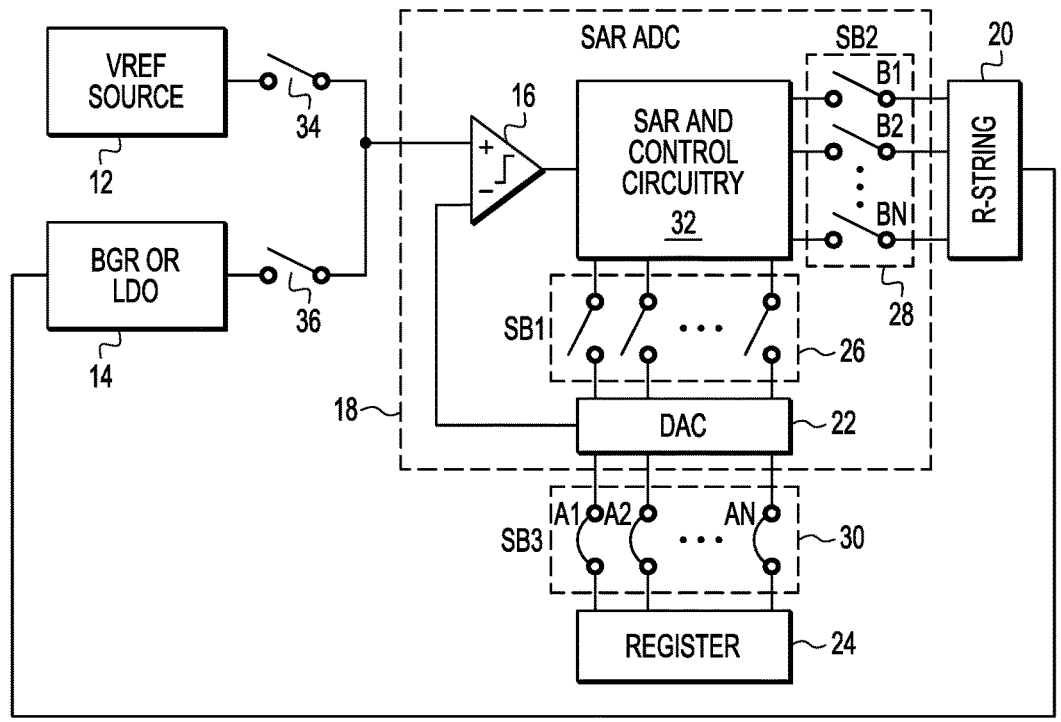
Figure 3:
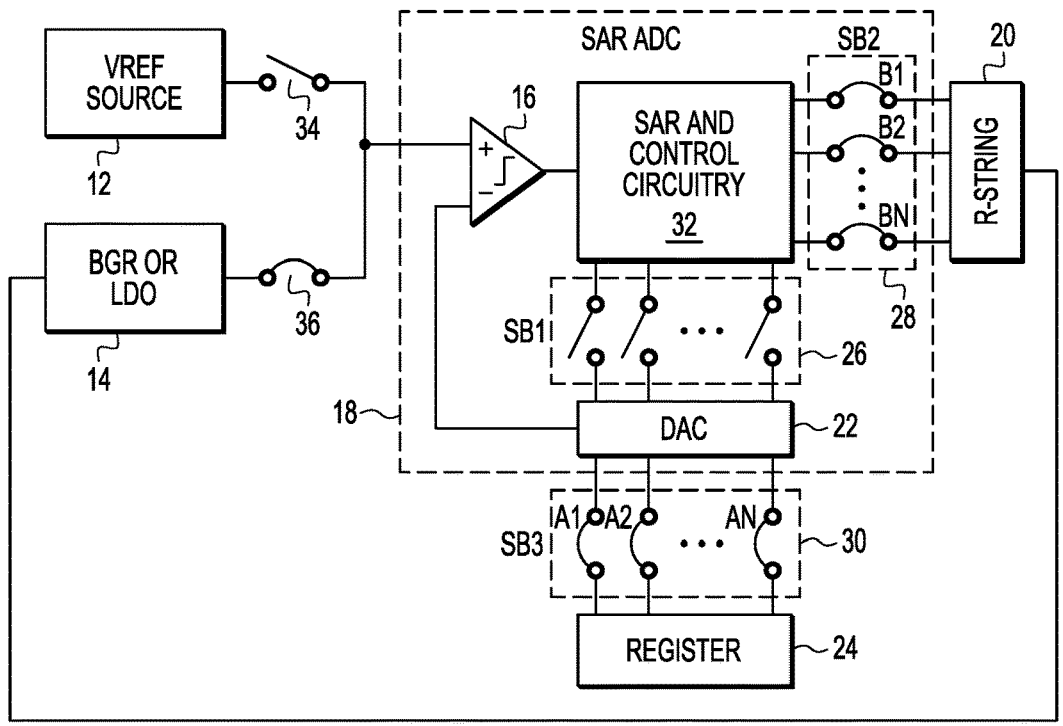

Note that the elements of FIGS. 2 and 3 are the same as FIG. 1, but with switches in different positions (in which the different configurations of the switches in each of FIGS. 1, 2, and 3 may correspond to different modes or phases of operation of trimming circuit 10). In operation, as will be described in more detail in reference to FIGS. 1-3, a reference voltage, Vref, is measured from an accurate source using the SAR ADC to obtain a digital code for Vref from the internal DAC (the DAC of the SAR ADC). Once the digital code is obtained and saved, it can be loaded into the internal DAC so the DAC may generate an accurate reference for the SAR ADC. With the DAC generating an accurate reference, the SAR ADC can perform trimming of LDO 14 through R-string 20.

Referring to FIG. 1, switch 34 is closed and switch 36 is open. Each switch in switch bank 28 and 30 is also open. The accurate Vref is provided to the non-inverting input of comparator 16 via switch 34. This accurate Vref can be provided by ATE (off-chip) or a trimmed BGR (on-chip or off-chip). SAR ADC 18 measures Vref and sets the bit values of A1-AN, which correspond to the digital code for Vref.

A SAR ADC, as known in the art, is a type of ADC which converts a continuous analog waveform into a discrete digital signal via a binary search through all possible quantization levels before finally converging upon a digital output for each conversion. In the illustrated embodiment, the SAR ADC includes N quantization levels in which each control value A1-AN is successively determined to appropriately close or open its corresponding switch. For example, the successive approximation is initialized by SAR and control circuitry 32 setting A1, the most significant bit (MSB), to a digital 1 (hence closing the switch). This code is fed into the internal DAC which supplies the analog equivalent of this digital code into the comparator (the inverting input of the comparator in the current embodiment) for comparison with the input voltage (Vref) at the non-inverting input of the comparator. If the analog voltage from the DAC exceeds Vref, the SAR and control circuitry 32 resets the A1 bit to a digital 0 (opening the switch), otherwise, A1 remains a 1. Then the next bit (e.g. A2) is set to 1 and the same test is done, continuing this binary search until every bit of A1-AN has been determined. The resulting values of A1-AN correspond to the digital code (i.e. the digital approximation) of the accurate Vref.

Referring back to FIG. 1, after the every bit of A1-AN has been determined, this resulting digital code for Vref is stored by SAR and control circuitry 32 into register 14. Note that any memory location may be used to store the resulting digital code rather than register 14.

FIG. 2 illustrates trimming circuit 10 with switches in a different configuration which allows for the loading of the digital code for the accurate Vref which was previously measured. After the digital code is obtained and stored, switch 34 is opened to decouple source 12 from trimming circuit 10. Also, each switch of switch banks 26 and 28 is opened, such that SAR and control circuitry 32 is disconnected from R-string 20 and DAC 22, as illustrated in FIG. 2. Each switch of switch bank 30 is closed such that DAC 22 is connected to register 24. The digital code stored in register 24 is then loaded into DAC 22, which allows DAC 22 to generate the accurate Vref. Note that, due to the previous measurement of Vref to obtain the digital code described in reference to FIG. 1, the accurate Vref can now be generated on-chip. This accurate Vref is then used by SAR ADC 18 for trimming LDO 14.

FIG. 3 illustrates trimming circuit 10 with switches in a different configuration which allows for trimming of LDO 14 using the Vref generated by DAC 22 with the digital code in register 14. Once the digital code is loaded into DAC 22, switch 36 is closed such that LDO 14 is now coupled to the non-inverting input of comparator 16. With DAC 22 disconnected from SAR and control circuitry 32, and the digital code already loaded from register 24, DAC 22 provides Vref to the inverting input of comparator 16. Based on Vref from DAC 22 and the analog input from LDO 14, SAR and control circuitry 32 determines the digital values (digital code) for each of B0-BN which configures R-string 20. SAR and control circuitry 32 determines the digital code (with the same number of quantization levels) just as described above with respect to A1-AN, but using the LDO analog output at the non-inverting input of comparator 16 and the digital output of DAC 22 at the inverting input of comparator 16.

Figure 4:
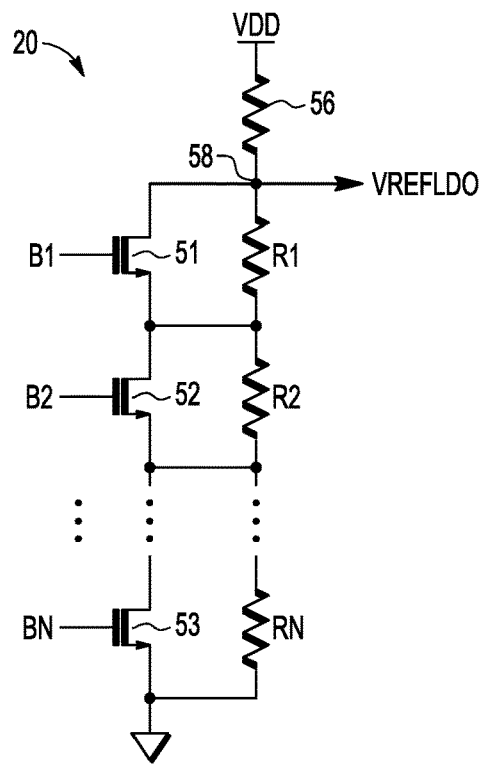
FIG. 4 illustrates, in schematic form, a resistor string (R-string) of the trimming circuit of FIGS. 1-3, in accordance with one embodiment of the present invention.

FIG. 4 illustrates, in schematic form, one embodiment of switch bank 28 with R-string 20. R-string 20 is a variable resistance circuit which includes a string of resistors, R1-RN, in which each resistor can be enabled (i.e. not shorted) or disabled (i.e. shorted) by a corresponding control value (control bit) of B1 to BN. R-string 20 also includes a resistor 56 coupled between R1 and VDD. A reference voltage for LDO 14, VREFLDO, is provided at a circuit node 58 between R1 and resistor 56. In one embodiment, each resistor is coupled in R-string 20 with a corresponding switch of switch bank 28, such as switches 51, 52, . . . 53, which are each implemented as an n-type transistor with the corresponding resistor connected between the current electrodes of each transistor, as seen in FIG. 4. Switch 53 and RN are connected to ground. When the corresponding control bit of B1-BN is a one, the corresponding resistor is shorted out from the resistor string by the corresponding switch, and when the corresponding control bit of B1-BN is a zero, the corresponding resistor is not shorted out (i.e. enabled) in the resistor string by the corresponding switch such that its resistance is additive to the resistor string. In one embodiment, each resistor from RN to R1, corresponding to BN to B1, respectively, has an increasing value by a power of 2. For example, RN may be 1 ohm, R(N−1) may be 2 ohm, R(N−3) may be 4 ohm, up until R1 which may have a resistance of $2^N$ ohms. The value of each of B1 to BN is provided in turn by SAR and control circuitry 32 to enable or disable (i.e. connect or disconnect) the corresponding resistor of R1 to RN to vary the resistance of R-string 20. Each resistor can be implemented as multiple resistor elements. In alternate embodiments, other variable resistance circuitries can be used in place of R-string 14. The value of R-string 20 changes VREFLDO, in which VREFLDO corresponds to a reference voltage connected to a negative input of an error amplifier in LDO 14. Therefore, after trimming, B0 to BN are determined, and VREFLDO is also determined accordingly. In this manner, a trimmed output of LDO 14 is obtained and provided to the second terminal of switch 36.

Referring back to FIG. 3, SAR and control circuitry 32 successively provides each bit from B0 to BN. During trimming of LDO 16, B1 to BN is reset to digital 0's such that all N resistors are enabled in R-string 20. SAR and control circuitry 32 begins by setting B1 to a digital value of 1. Comparator 16 then compares the output of LDO 16 to Vref (from DAC 22), and, based on the comparison, either leaves B1 as a 1 or resets it to a 0. For example, if Vref is larger than the output of LDO 16, SAR and control circuitry 32 keeps B1 as a 1, and otherwise, resets B1 to 0. This process is continued with each of B2-BN until the digital code B1-BN is completed and thus provides a trimmed code for LDO 14. Note that trimming may occur any time during operation, as needed. Since a digital code for A1-AN was previously stored, an accurate Vref can be generated on-chip each time a trimming of LDO 10 is needed.

Note that in alternate embodiments, R-string may be implemented by different circuitry, such as by using capacitive elements instead. Also, as stated above, other circuits, such as other PMU circuits may be trimmed by using the stored digital code for Vref. For example, LDO 14 may be a BGR instead which may receive a reference voltage from R-string 20. SAR ADC 18 may be repeated as needed for any LDO or BGR in the SoC to allow for on-chip, post-production trimming of the internal voltage supplies provided by the LDOs and BGRs.

Therefore, by now it can be appreciated how an SAR ADC can be used to measure an accurate voltage source and store a corresponding digital code, and then subsequently be used, along with the stored digital code, in post-production to trim on-chip PMU circuits. That is, with the stored digital code representation of an accurate Vref, this Vref can be reproduced on-chip by the internal DAC of the SAR ADC to allow for trimming of such circuits, such as LDOs or BGRs.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also for example, in one embodiment, the illustrated elements of circuit 10 are circuitry located on a single integrated circuit or within a same semiconductor device. Alternatively, circuit 10 may include any number of separate integrated circuits or separate devices interconnected with each other. Also, the source for Vref 12 may be located either on a same integrated circuit as circuit 10 or be an external source.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different types of trimming may be used other than a resistor string in which the trimming is controlled by the setting of the digital code for B1-BN. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device including a built-in trimming circuit includes an analog to digital converter (ADC) circuit including a comparator circuit, a digital approximation and control circuit having an input coupled to an output of the comparator circuit, and a digital to analog converter (DAC) circuit; a first set of switches configured to selectively couple inputs of the DAC circuit to outputs of the digital approximation and control circuit; a second set of switches configured to selectively couple outputs of the DAC circuit to a storage component; a third set of switches configured to selectively couple outputs of the ADC circuit to a power management circuit. In one aspect of this embodiment, the semiconductor device further includes a variable resistance circuit coupled between the third set of switches and the power management circuit. In another aspect, the semiconductor device further includes a storage component configured to be selectively coupled to the DAC circuit using the second set of switches. In a further aspect, the semiconductor device further includes an output of the DAC circuit is coupled to an input of the comparator. In another further aspect, the semiconductor device further includes an output of the variable resistance circuit is coupled to an input of the power management circuit. In another aspect, the semiconductor device further includes a reference voltage source; a fourth switch configured to selectively couple the reference voltage source to a first input of the comparator during a first mode of operation. In a further aspect, the semiconductor device further includes a fifth switch configured to selectively couple the power management circuit to the first input of the comparator during a third mode of operation. In another aspect, the first set of switches are set to decouple the inputs of the DAC circuit from the outputs of the digital approximation and control circuit during second and third modes of operation; the second set of switches are set to decouple the outputs of the DAC from the storage component during a first mode of operation; the third set of switches are set to decouple the outputs of the ADC circuit from the power management circuit during the third mode of operation. In a further aspect, the semiconductor device further includes the power management circuit is formed on a single substrate with the ADC circuit, and the first, second and third sets of switches. In another aspect, the digital approximation and control circuit includes a successive approximation register coupled to receive the output of the comparator.

In another embodiment, a semiconductor device includes power management circuit; and a trimming circuit coupled to the power management circuit including: an analog to digital converter (ADC) circuit including: a comparator circuit, a successive approximation register (SAR) circuit having an input coupled to an output of the comparator circuit, a control circuit coupled to the SAR circuit, a digital to analog converter (DAC) circuit having inputs selectively couplable to digital output signals of the SAR circuit and an output coupled to a first input of the comparator circuit, and a variable resistance circuit configured to be selectively coupled to output signals of the ADC circuit. In one aspect of the another embodiment, the semiconductor device further includes a storage register circuit; and a set of switches configured to selectively couple and decouple the outputs from the DAC circuit to the storage register circuit. In another aspect, the semiconductor device further includes a reference voltage source; a switch to selectively couple and decouple the reference voltage source to a second input of the comparator circuit. In a further aspect, the semiconductor device further includes a switch to selectively couple and decouple the power management circuit to the second input of the comparator circuit. In another aspect. the semiconductor device further includes a set of switches configured to selectively couple and decouple the digital to analog converter (DAC) circuit to the digital output signals of the SAR circuit. In another aspect, the semiconductor device further includes a set of switches configured to selectively couple and decouple the ADC circuit to the variable resistance circuit.

In yet another embodiment, a method of trimming a power management circuit includes during a first phase of operation: connecting a reference voltage source to a first input of a comparator, and generating a first digital code in an analog to digital converter (ADC) circuit for a reference voltage provided by the reference voltage source; during a second phase of operation: providing the first digital code to the DAC circuit, converting the first digital code to an analog signal of the reference voltage, and providing the analog code to a second input of the comparator; during a third phase of the operation: connecting the power management circuit to the first input of the comparator while the analog signal is provided to the second input of the comparator, and while the power management circuit is connected to the first input of the comparator and the analog signal is provided to the second input of the comparator: generating a digital code in the ADC circuit for the output of the comparator, generating a second digital code in the ADC circuit, and providing the second digital code as input to a variable resistance circuit, using output of the variable resistance circuit as a trim value for the power management circuit. In one aspect of the yet another embodiment, the method further includes storing the first digital code in a register circuit; and providing the first digital code from the register circuit to the DAC circuit during the second phase of operation. In a further aspect, the method further includes during the second phase of operation: decoupling the reference voltage source from the comparator, decoupling the DAC circuit from the ADC circuit, and decoupling the variable resistance circuit from the ADC circuit. In another aspect, the method further includes during the third phase of operation: coupling the ADC circuit to the variable resistance circuit, and decoupling the variable resistance circuit from the ADC circuit.

What is claimed is:

1. A semiconductor device including a built-in trimming circuit comprising:
   an analog to digital converter (ADC) circuit including
      a comparator circuit,
      a digital approximation and control circuit having an input coupled to an output of the comparator circuit, and
      a digital to analog converter (DAC) circuit;
   a first set of switches configured to selectively couple inputs of the DAC circuit to outputs of the digital approximation and control circuit;
   a second set of switches configured to selectively couple outputs of the DAC circuit to a storage component;
   a third set of switches configured to selectively couple outputs of the ADC circuit to a power management circuit.

2. The semiconductor device of claim 1 further comprising:
   a variable resistance circuit coupled between the third set of switches and the power management circuit.

3. The semiconductor device of claim 1 further comprising:
   a storage component configured to be selectively coupled to the DAC circuit using the second set of switches.

4. The semiconductor device of claim 2 further comprising:
   an output of the DAC circuit is coupled to an input of the comparator.

5. The semiconductor device of claim 4 further comprising:
   an output of the variable resistance circuit is coupled to an input of the power management circuit.

6. The semiconductor device of claim 1 further comprising:
   a reference voltage source;
   a fourth switch configured to selectively couple the reference voltage source to a first input of the comparator during a first mode of operation.

7. The semiconductor device of claim 6 further comprising:
   a fifth switch configured to selectively couple the power management circuit to the first input of the comparator during a third mode of operation.

8. The semiconductor device of claim 1 wherein:
   the first set of switches are set to decouple the inputs of the DAC circuit from the outputs of the digital approximation and control circuit during second and third modes of operation;
   the second set of switches are set to decouple the outputs of the DAC from the storage component during a first mode of operation;
   the third set of switches are set to decouple the outputs of the ADC circuit from the power management circuit during the third mode of operation.

9. The semiconductor device of claim 8 further comprising:
   the power management circuit is formed on a single substrate with the ADC circuit, and the first, second and third sets of switches.

10. The semiconductor device of claim 1 wherein:
    the digital approximation and control circuit includes a successive approximation register coupled to receive the output of the comparator.

11. A semiconductor device comprising:
    a power management circuit; and
    a trimming circuit coupled to the power management circuit including:
       an analog to digital converter (ADC) circuit including:
          a comparator circuit,
          a successive approximation register (SAR) circuit having an input coupled to an output of the comparator circuit,
          a control circuit coupled to the SAR circuit,
          a digital to analog converter (DAC) circuit having inputs selectively couplable to digital output signals of the SAR circuit and an output coupled to a first input of the comparator circuit, and
       a variable resistance circuit configured to be selectively coupled to output signals of the ADC circuit.

12. The semiconductor device of claim 10 further comprising:
    a storage register circuit; and
    a set of switches configured to selectively couple and decouple the outputs from the DAC circuit to the storage register circuit.

13. The semiconductor device of claim 10 further comprising:
    a reference voltage source;
    a switch to selectively couple and decouple the reference voltage source to a second input of the comparator circuit.

14. The semiconductor device of claim 12 further comprising:
   a switch to selectively couple and decouple the power management circuit to the second input of the comparator circuit.

15. The semiconductor device of claim 10 further comprising:
   a set of switches configured to selectively couple and decouple the digital to analog converter (DAC) circuit to the digital output signals of the SAR circuit.

16. The semiconductor device of claim 10 further comprising:
   a set of switches configured to selectively couple and decouple the ADC circuit to the variable resistance circuit.

17. A method of trimming a power management circuit comprising:
   during a first phase of operation:
      connecting a reference voltage source to a first input of a comparator, and
      generating a first digital code in an analog to digital converter (ADC) circuit for a reference voltage provided by the reference voltage source;
   during a second phase of operation:
      providing the first digital code to the DAC circuit,
      converting the first digital code to an analog signal of the reference voltage, and
      providing the analog code to a second input of the comparator;
   during a third phase of the operation:
      connecting the power management circuit to the first input of the comparator while the analog signal is provided to the second input of the comparator, and
      while the power management circuit is connected to the first input of the comparator and the analog signal is provided to the second input of the comparator:
         generating a digital code in the ADC circuit for the output of the comparator,
         generating a second digital code in the ADC circuit,
         providing the second digital code as input to a variable resistance circuit, and
         using output of the variable resistance circuit as a trim value for the power management circuit.

18. The method of claim 17 further comprising:
   storing the first digital code in a register circuit; and
   providing the first digital code from the register circuit to the DAC circuit during the second phase of operation.

19. The method of claim 18 further comprising:
   during the second phase of operation:
      decoupling the reference voltage source from the comparator;
      decoupling the DAC circuit from the ADC circuit, and
      decoupling the variable resistance circuit from the ADC circuit.

20. The method of claim 17 further comprising:
   during the third phase of operation:
      coupling the ADC circuit to the variable resistance circuit, and
      decoupling the variable resistance circuit from the ADC circuit.

* * * * *